United States Patent [19]

Mori et al.

[11] Patent Number: 5,660,645
[45] Date of Patent: Aug. 26, 1997

[54] SOLAR CELL MODULE

[75] Inventors: Takahiro Mori, Ikoma; Ichiro Kataoka, Tsuzuki-gun; Satoru Yamada; Hidenori Shiotsuka, both of Tsuzuki-gun; Ayako Komori, Nara, all of Japan

[73] Assignee: Canon Kabushiki Kaisha, Tokyo, Japan

[21] Appl. No.: 428,521

[22] Filed: Apr. 25, 1995

[30] Foreign Application Priority Data

Apr. 28, 1994 [JP] Japan ................ 6-92757

[51] Int. Cl.⁶ .................... H01L 31/048
[52] U.S. Cl. .............. 136/251; 136/259; 257/433
[58] Field of Search ............... 136/251, 259; 257/453

[56] References Cited

U.S. PATENT DOCUMENTS 5,344,498  9/1994  Inoue ................ 136/251
5,447,576  9/1995  Willis ................ 136/259
5,476,553  12/1995  Hanoka et al. ........ 136/251

OTHER PUBLICATIONS

Willis, et al., "Investigation of Test Methods, Material Properties, and Processes for Solar Cell Encapsulants", U.S. Department of Energy, Jun. 1979, DOE/JPL/954527–79/11.

Primary Examiner—Aaron Weisstuch
Attorney, Agent, or Firm—Fitzpatrick, Cella, Harper & Scinto

[57] ABSTRACT

A solar cell module is provided which comprises a photoactive semiconductor layer as a photovoltaic element and a transparent surface coating material provided on the light-introducing side, the surface coating material containing a light stabilizer comprising an alkylated tertiary amine compound. This surface coating layer for the solar cell module has high weatherability and high heat resistance, thereby minimizing the deterioration of the performance of the photovoltaic element in long-term use, and protects the module from external impact.

29 Claims, 1 Drawing Sheet

SOLAR CELL MODULE

BACKGROUND OF THE INVENTION

1. Field of the Invention

The present invention relates to a solar cell module, particularly to a solar cell module which has a light-introducing side (incident light face) coated with a resin.

2. Relating Background Art

In recent years, environmental pollution has become a worldwide concern. In particular, global temperature rise caused by the greenhouse effect of emitted carbon dioxide is a serious problem. Therefore, clean energy generation without using fossil fuels is strongly desired. The solar cell, which is a photoelectric converter element, is promising as a clean energy source at the present time because of its safety and ease of handling.

The known solar cells include various types, typically exemplified by crystalline silicon solar cells, polycrystalline silicon solar cells, amorphous silicon solar cells (including microcrystal cells), copper indium selenide solar cells, other compound semiconductor solar cells, and the like. Of these, polycrystalline silicon solar cells, compound semiconductor solar cells, and amorphous silicon solar cells are being actively studied since these types of solar cells can readily be produced in a large-area form at a low cost.

Further, of these solar cells, thin film solar cells typified by amorphous silicon type solar cells, which are produced by depositing amorphous silicon on an electroconductive metal substrate and forming thereon a transparent electroconductive layer, are promising for future use as a module because of the light weight, the high impact strength, and the high flexibility thereof. However, this type of module needs to have the light-introducing face covered with a transparent material to protect the solar cell, differently from the one produced by depositing silicon on a glass substrate. Usually, glass or transparent fluororesins such as a fluororesin film, a fluororesin coating and the like have been used as the outermost coating material. Beneath the outermost covering layer, various transparent thermoplastic organic resins may be used as a filler. Glass is employed as the outermost layer because of its high weatherability which maintains the light transmissivity and thus does not cause a reduction in the conversion efficiency of the solar cell module. On the other hand, the fluororesin is employed as the outermost layer because of its high weatherability and high water-repellency which maintain the light transmissivity and thus do not cause a reduction of the conversion efficiency of the solar cell module resulting from deterioration or soiling of the surface, and further because of the ease of the sealing of the solar cell module by heat treatment. A thermoplastic resin is employed as the filler because it is inexpensive when used in a large amount for protection of the inner contained photovoltaic element.

FIG. 4 shows an example of such a conventional solar cell module. In FIG. 4, the module is constituted of a fluororesin layer 401, a transparent thermoplastic organic resin layer 402, a photovoltaic element 403, and an insulation layer 404. In this example, the same organic resin used for the light-receiving face is used for the back face insulation layer. More specifically, the fluororesin film 401 is exemplified by a film of ETFE (ethylene-tetrafluoroethylene copolymer), and a film of PVF (polyvinyl fluoride). The transparent thermoplastic organic resin 402 is exemplified by EVA (ethylene-vinyl acetate copolymer), and butyral resins. As the insulation layer 404, various organic resin films such as a nylon film, an aluminum-laminated Tedlar film, and the like may be used. In this example, the transparent thermoplastic organic resin 402 serves as an adhesive for bonding between the photovoltaic element 403 and the fluororesin 401, and between the photovoltaic element 403 and the insulation layer 404 if present therebetween, and also serves as a filler for protecting the solar cell from external scratching and impact.

No material is known, however, which simultaneously gives weatherability and impact strength, in the aforementioned surface coating constitution, especially in the case where the solar cell is exposed to a natural environment for a long time, e.g. twenty years or more. Specifically, a glass sheet as the outermost surface layer is liable to be broken by hailstorm or impact by a small stone and thus fail to protect the photovoltaic member. On the other hand, a fluororesin as the outermost surface layer loses weatherability owing to loss of stabilizers contained therein by decomposition by UV light, water or heat, by volatilization or elution by heat or water for a long term of outdoor exposure of twenty years or more, resulting in deterioration of the solar cell. Generally, resins become colored under action of ultraviolet light, ozone, nitrogen oxides, or heat. In particular, tandem junction laminated photoactive semiconductor layers, for which a non-monocrystalline semiconductor, preferably an amorphous silicon semiconductor is used, are greatly adversely affected in conversion efficiency by discoloration of surface coating material. More specifically, a tandem laminated photovoltaic member generates electricity in each of the laminated photoactive semiconductor layers respectively at different wavelengths of light. Therefore, if shorter wavelengths of light are absorbed by discolored surface coating material, the photoactive semiconductor layer absorbing the shorter wavelengths of light generates less electric current, and consequently the other photoactive semiconductor layers operate under current-limiting conditions to greatly lower the overall conversion efficiency of the photovoltaic member.

When the surface layer is a fluororesin, the resin stabilizer volatilizes to lower the conversion efficiency significantly in comparison with a glass surface layer. A resin photo stabilizer is described in a report of JPL (US Jet Promotion Laboratory) entitled "Department of Energy Investigation of Test Methods, Material Properties, and Processes for Solar Cell Encapsulants", Annual Report, June, 1979. Specifically, the stabilizer is bis(2,2,6,6-tetramethyl-4-piperidyl) sebacate. However, such a secondary amine type of photo stabilizer does not improve sufficiently the photostability and heat resistance of the resin. The above problem is more significant in solar cell modules having no cooling means and in modules integrated with building materials such as a roof exposed to high temperatures. At a module temperature of 80° C. or higher, the surface coating material of the module is discolored at a higher discoloring rate.

The manufacturing process of a solar cell module generally includes a heat bonding step at about 130° to 160° C. for about 20 to 100 minutes. The heat bonding conditions depend on the crosslinking degree of the resins such as EVA which are fillers and adhesives. This heat bonding step can be accelerated by raising the temperature to shorten the treatment time. However, the high temperature will cause slight discoloration of the module after the heat bonding to disadvantageously decrease the initial conversion efficiency. One method for offsetting such a disadvantage may be selection of a cross linking agent, namely an organic peroxide having a lower decomposition temperature, to a be mixed in the filler resin: for example, selection of an organic peroxide having a radical-generating temperature lower by about 20° C. However, use of a low-temperature crosslinking filler results in insufficient bonding strength of the component members with the filler, although the discoloration of the resin after the heat bonding can be prevented. Solar cell modules designed for roof use, which are required to have good appearance, are designed to be reinforced with a colored steel plate. The colored steel plate is produced generally by use of a silicone type leveling agent for the purpose of preventing pin-hole formation on coating application and preventing soiling. For bonding to such a coated steel plate, sufficient bonding strength can be achieved only by a radical abstraction reaction using an organic peroxide. The aforementioned low-temperature-crosslinked filler, which can generate radicals, does not provide sufficient covalent bonds because of the low temperature of the member. Accordingly, there is a problem that the bonding strength in this case is lower than that by heat-bonding at a high temperature.

SUMMARY OF THE INVENTION

The present invention provides a solar cell module which is coated with a surface coating material, having high weatherability and high heat resistance, being protected from long-term deterioration of the photovoltaic element, and being protected from external impact.

The solar cell module of the present invention comprises a photoactive semiconductor layer as a photovoltaic element and a transparent surface coating material layer provided on the light-introducing side thereof, the surface coating layer containing a photo stabilizer comprising an alkylated tertiary amine compound.

DESCRIPTION OF THE PREFERRED EMBODIMENT

The solar cell module of the present invention comprises a photoactive semiconductor layer as a photovoltaic element and a transparent surface coating material layer provided on a light-introducing side of the photovoltaic element, wherein the surface coating layer contains a photo stabilizer comprising an alkylated tertiary amine compound.

This solar cell module has advantages as described below. The solar cell module deteriorates less in conversion efficiency even after long-term use. The solar cell module is resistant to external impact due to use of a fluororesin based film as an outermost surface coating layer. The solar cell module is produced at low cost by use of an ethylene type copolymer resin as a filler. The solar cell module is made humidity-resistant by use of a copolymer of an unsaturated fatty acid ester as the filler material. The solar cell module is excellent in weatherability, especially in photostability, by use of a surface coating material containing an inorganic ultraviolet absorber. The solar cell module is excellent in photostability due to use of a surface coating material containing a high-polymeric ultraviolet absorber.

After comprehensive studies, it was found by the inventors of the present invention that alkylated tertiary amine compounds are excellent as the photo stabilizer for the solar cell module. The present invention is described below in more detail.

Module

Figure 1:
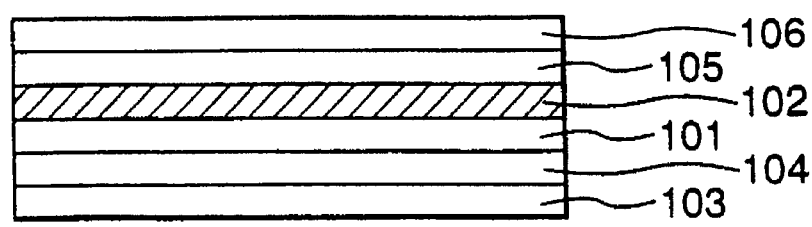
FIG. 1 is a schematic sectional view of an example of the solar cell module of the present invention.

FIG. 1 illustrates schematically the constitution of a solar cell module of the present invention. In FIG. 1, light is introduced from above. The module is constituted of a substrate 101, a photovoltaic element 102, a backside coating film 103, a filler 104 on the back side, a transparent filler on the front side 105, and an outermost transparent surface film 106. Light is introduced via the uppermost film 106 to reach the photovoltaic element 102, in which the generated electromotive force is outputted through an output terminal (not shown in the drawing). In the case where the light is introduced from the bottom side through the substrate 101 made of a transparent resin or the like, the backside filler 104 and the backside coating film are made transparent.

Figure 2:
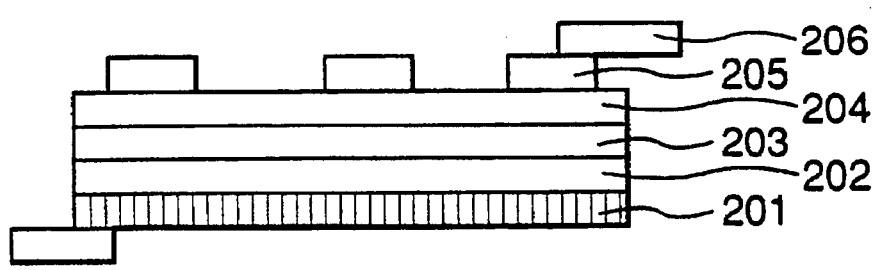
FIG. 2 is a schematic sectional view showing the constitution of a photovoltaic element used in the solar cell module of the present invention.

The photovoltaic element 102 in the present invention is constituted of at least an electroconductive substrate, and a photoactive semiconductor layer formed thereon as a photovoltaic member. In a preferred embodiment, the photovoltaic element has a shunt resistance ranging from 2,000 to 200,000 $\Omega cm^2$. FIG. 2 schematically shows an example of the constitution. The photovoltaic element in FIG. 2 comprises an electroconductive substrate 201, a backside reflection layer 202, a photoactive semiconductor layer 203, a transparent electroconductive layer 204, and collecting electrode 205.

Electroconductive Substrate 201

The electroconductive substrate 201 serves as a base member for the photovoltaic element as well as a lower-side electrode. Examples of materials thereof include silicon, tantalum, molybdenum, tungsten, stainless steel, aluminum, copper, titanium, carbon sheet, lead-plated steel, and resin films, and ceramics and glass having an electroconductive layer formed thereon. On the above electroconductive substrate 201, a backside reflection layer 202 may be formed from a metal layer, a metal oxide layer, or a lamination thereof. The metal layer is formed from Ti, Cr, Mo, W, Al, Ag, Ni, Cu, and the like. The metal oxide layer is formed from ZnO, $TiO_2$, $SnO_2$, ITO, and the like. The metal layer and the metal oxide layer may be formed by resistance heating vapor deposition, electron beam vapor deposition, sputtering, or like method.

Photoactive Semiconductor Layer 203

The photoactive semiconductor layer 203 performs photovoltaic conversion. The specific materials therefor include pn junction type polycrystalline silicon, pin junction type amorphous silicon, and compound semiconductors and junctions such as $CuInSe_2$, $CuInS_2$, GaAs, $CdS/Cu_2S$, CdS/CdTe, CdS/InP, and $CdTe/Cu_2Te$. The polycrystalline polysilicon type photoactive semiconductor layer may be formed by a process such as sheet formation from molten silicon, and heat treatment of amorphous silicon. The amorphous silicon type photoactive semiconductor layer may be formed by plasma CVD using a silane gas. The compound semiconductor type photoactive semiconductor layer may be formed by ion plating, ion beam deposition, vacuum vapor deposition, sputtering, electrodeposition, and like method.

Transparent Electroconductive Layer 204

The transparent electroconductive layer 204 serves as an upper-side electrode. Specific examples of the material therefore include $In_2O_3$, $SnO_2$, $In_2O_3$—$SnO_2$ (ITO), ZnO, $TiO_2$, $Cd_2SnO_4$, and crystalline semiconductor layers doped with a high concentration of an impurity. The layer may be formed by resistance-heating vapor deposition, sputtering, spraying, CVD impurity diffusion, and like methods.

Collecting Electrode 205

On the transparent electroconductive layer, a grid type collecting electrode 205 (grid) may be provided in order to efficiently collect the generated current. Specific examples of the material for the collecting electrode 205 include Ti, Cr, Mo, W, Al, Ag, Ni, Cu, Sn, and alloys thereof, and an electroconductive paste such as silver paste. The collecting electrode 205 may be formed by sputtering, resistance heating, and CVD employing a mask pattern; metal film deposition and subsequent etching for patterning; direct grid electrode pattern formation by photo-assisted CVD; formation of a negative pattern mask of the grid electrode and subsequent metal plating; printing with electroconductive paste, bonding of metal wires, and like methods. The electroconductive paste generally includes a dispersion of powder of silver, gold, copper, nickel, carbon or the like in a polymeric binder. The polymeric binder includes polyester resins, epoxy resins, acrylic resins, alkyd resins, polyvinyl acetate resins, rubbers, urethane resins, and phenol resins.

Output Terminal 206

Finally, terminals 206 for outputting the electromotive force are bonded to the electroconductive substrate and the collecting electrode. To the electroconductive substrate, a metal article such as copper tab is bonded by spot welding or soldering. The collecting electrode, a metal wire or tab is electrically fastened with electroconductive paste or solder.

The photovoltaic elements prepared by the above procedure may be joined in series or in parallel according to the desired voltage or current. Alternatively, the photovoltaic elements may be integrated on the insulated substrate to obtain a desired voltage or current.

Backside Coating Film 103

The backside coating film 103 electrically insulates the electroconductive substrate 101 of the photovoltaic element from the outside. The material therefor is desired to have sufficient electrical insulation property, sufficient durability over a long term, durability against thermal expansion and thermal constriction, and flexibility. Specific examples are films of nylon and polyethylene terephthalate.

Backside Filler 104

The backside filler 104 bonds the backside coating film 103 to the substrate 101. The material therefor must have sufficient bonding properties and long-term durability against thermal expansion and constriction, and flexibility. Preferred examples therefor include hot-melt adhesives such as EVA and polyvinylbutyral, double-side coated tapes, and flexible epoxy adhesives.

In the case where the solar cell module is used at a high temperature, for example, in integration with a building material such as a roof material, the filler is preferably crosslinked in order to ensure adhesion at high temperatures. The crosslinking of the filler material such as EVA is generally conducted with an organic peroxide.

A reinforcing plate may be attached to the external surface of the backside coating film to increase the mechanical strength or to prevent distortion and warpage of the solar cell module. The reinforcing plate is preferably made of steel, plastic, FRP (glass fiber reinforced plastics), or the like.

Filler 105

The filler 105 is a resin employed to cover the surface roughness of the photovoltaic element and to ensure the bonding to the surface film. Therefore, the filler is required to have weatherability, adhesiveness, and heat resistance. Any material which satisfies the above requirements may be used therefor. As the filler material, ethylene type copolymers are especially preferred since this type of copolymer has high heat resistance and high adhesiveness, and is inexpensive. EVA resins (ethylene-vinyl acetate copolymer resins) have been preferred for these reasons. However, EVA is hygroscopic. The hygroscopicity of EVA does not pose any problem in the case of a module covered with glass or of a crystal type solar cell having substantially no pores or pinholes. However, a module covered with a resin film has a larger hygroscopicity than one covered with glass. Therefore, moisture may permeate into a photovoltaic layer, causing a shunt. Since a non-monocrystalline semiconductor, such as an amorphous one as preferred in the present invention, unavoidably contains pores or pinholes, the hygroscopicity of EVA may be problematic. Less hygroscopic fillers include unsaturated fatty acid ester copolymers such as EEA (ethylene-ethyl acrylate copolymer) and EMA (ethylene-methyl methacrylate copolymer), which gives flexibility at a lower copolymerization ratio than EVA. That is, flexibility can be achieved with less content of the ester units, which are hygroscopic groups. Specifically, EEA having 25% ethyl acrylate units has nearly the same mechanical properties as EVA having 33% copolymerized vinyl acetate units, and the EEA is superior in low-temperature brittleness to the EVA.

The filler is preferably in a film shape before heat bonding. The above materials are molded into a film shape, for example, by extrusion molding such as blow molding and T-die molding.

Crosslinking Agent

The filler is desirably crosslinked in consideration of the high temperature operating environment conditions. The crosslinking is conducted by addition of isocyanates, melamines, and organic peroxides.

When a diisocyanate is used, a blocking agent is preferably used in combination to prevent the crosslinking reaction during the extrusion molding. The preferred isocyanates used in the present invention include aliphatic isocyanates, and water-modified aromatic isocyanates, specifically exemplified by hexamethylene diisocyanate, isophorone diisocyanate, and water-modified methylene diphenyl diisocyanate.

The melamine used in the present invention includes hexakismethylmelamine and the like.

The blocking agent for the isocyanates includes ε-caprolactam, methyl ethyl ketone oxime, ethyl acetoacetate, phenol, and alcohols such as ethanol, n-propanol, isopropanol, n-butanol, isobutanol, and t-butanol. The blocking agent is required to not become free during the extrusion molding process, but to become free in the crosslinking step to cause reaction with hydroxyl groups in the filler. The above ε-caprolactam is preferred as a high-temperature dissociation type blocking agent.

The crosslinking of EVA is generally conducted with an organic peroxide. The crosslinking reaction proceeds by abstraction of hydrogen atoms or halogen atoms from the resin molecules by free radicals generated from the organic peroxide to form carbon-carbon bonding. The organic peroxide is known to be activated by thermal decomposition, redox decomposition, or ionic decomposition. Generally, thermal decomposition is preferred.

The organic peroxide is classified, according to the chemical structure, roughly into hydroperoxides, dialkyl(aryl) peroxides, diacyl peroxides, peroxyketals, peroxyesters, peroxycarbonates, and ketone peroxides.

The hydroperoxides include t-butyl peroxide, 1,1,3,3-tetramethylbutyl peroxide, p-menthane hydroperoxide, cumeme hydroperoxide, p-cymeme hydroperoxide, diisopropylbenzene peroxide, 2,5-dimethylhexane 2,5-dihydroperoxide, cyclohexane peroxide, and 3,3,5-trimethylhexanone peroxide.

The dialkyl(aryl) peroxides include di-t-butyl peroxide, dicumyl peroxide, and t-butylcumyl peroxide.

The diacyl peroxides include diacetyl peroxide, dipropionyl peroxide, diisobutyryl peroxide, dioctanoyl peroxide, didecanoyl peroxide, dilauroyl peroxide, bis(3,3,5-trimethylhexanoyl) peroxide, benzoyl peroxide, m-tolyl peroxide, p-chlorobenzoyl peroxide, 2,4-dichlorobenzoyl peroxide, and peroxysuccinic acid.

The peroxyketals include 2,2-di-t-butylperoxybutane, 1,1-di-t-butylperoxycyclohexane, 1,1-di-(t-butylperoxy)-3,3,5-trimethylcyclohexane, 2,5-dimethyl-2,5-di-(t-butylperoxy)hexane, 2,5-dimethyl-2,5-di(t-butylperoxy) hexyne-3, 1,3-di(t-butylperoxyisopropyl)benzene, 2,5-dimethyl-2,5-dibenzoylperoxyhexane, 2,5-dimethyl-2,5-di (peroxybenzoyl)hexyne-3, and n-butyl-4,4-bis(t-butylperoxy) valerate.

The peroxyesters include t-butylperoxy acetate, t-butylperoxy isobutyrate, t-butylperoxy pivalate, t-butylperoxy neodecanoate, t-butylperoxy 3,3,5-trimethylhexanoate, t-butylperoxy 2-ethylhexanoate, (1,1,3,3-tetramethylbutylperoxy) 2-ethylhexanoate, t-butylperoxy laurate, t-butylperoxy benzoate, di(t-butylperoxy) adipate, 2,5-dimethyl-2,5-di(peroxy-2-ethylhexanoyl)hexane, di(t-butylperoxy) isophthalate, t-butylperoxy maleate, and acetylcyclohexylsulfonyl peroxide.

The peroxycarbonates include t-butylperoxy isopropyl carbonate, di-n-propylperoxy dicarbonate, di-sec-butylperoxy carbonate, di(isopropylperoxy) dicarbonate, di(2-ethylhexylperoxy) dicarbonate, di(2-ethoxyethylperoxy) dicarbonate, di(methoxyisopropylperoxy) carbonate, di(3-methoxybutylperoxy) dicarbonate, and bis(4-t-butylcyclohexylperoxy) dicarbonate.

The ketone peroxides include acetylacetone peroxide, methyl ethyl ketone peroxide, methyl isobutyl ketone peroxide, and ketone peroxide.

Furthermore, vinyl-tris(t-butylperoxy) silane and the like are known as useful peroxides.

The organic peroxide is used in an amount of 0.5 to 5 parts by weight based on 100 parts by weight of the filler resin.

The heat bonding conditions depend on the radical generation temperature of the organic peroxide and the bonding strength of the members of the present invention. Generally, the heat bonding conditions are selected such that ¼ or less of the initial amount of the added organic peroxy compound is decomposed. That is, when the half life of the organic peroxy compound is known at a certain heat bonding temperature, the heat bonding is conducted for a time longer than twice the half life. For filling of EVA, the heat bonding is preferably conducted at a temperature ranging from 90° to 180° C., more preferably from 110° to 160° C., for a time of 10 minutes or longer. If the heat boding is conducted at a lower temperature for a shorter time than the above lower limits, the organic peroxide does not decompose sufficiently, causing insufficient crosslinking. The insufficient crosslinking of EVA will cause the flow of EVA at high temperature to result in wrinkling of the coating materials. The wrinkles will not disappear on cooling, causing a defective appearance. The insufficient crosslinking may cause creep of EVA (slippage of EVA) when the module is in an inclined orientation. The heat bonding at a temperature higher than the above higher limit causes yellowing of EVA as the filler, whereby the initial conversion efficiency of the module is remarkably lowered.

Electron Beam Curing

The filler film is preferably heat bonded to the photovoltaic element after the completion of crosslinking with the above crosslinking agents by heating at a high temperature. Another way of crosslinking is exposure of the filler film to rays such as electron beams and γ-rays. Industrially, electron beams are preferred.

The electron beam exposure systems are classified into a scanning type and a non-scanning type. The scanning type is suitable for acceleration voltages of 300 KeV or higher, and the non-scanning type, 300 KeV or lower. For a film of thickness not less than 500 μm, an acceleration voltage of 300 KeV or higher is preferred. The dose of the electron beams is generally 1 to 100 Mrad, depending on the filler material. At a dose of higher than 100 Mrad, the filler material tends to turn yellow or to be decomposed by generated heat. A crosslinking aid such as triallyl isocyanurate may be employed together with the crosslinking agent in order to more efficiently perform electron beam crosslinking.

Silane Coupling Agent

The filler film can be improved to have higher bonding strength to the photovoltaic element surface by employing a silane coupling agent in combination. The silane coupling agent includes vinyltrichlorosilane, vinyl-tris(β-methoxyethoxy)silane, vinyltriethoxysilane, vinyltrimethoxysilane, γ-methacryloxypropyltrimethoxysilane, β-(3,4-epoxycyclohexyl)ethyltrimethoxysilane, γ-glycidoxypropylmethyldiethoxysilane, N-β(aminoethyl)-γ-aminopropyltrimethoxysilane, N-β(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, γ-chloropropyltrimethoxysilane, and the like.

Instead of the addition of the silane coupling agent to the filler film, the silane coupling agent may be applied and dried on the photovoltaic element. In this method, the excess silane coupling agent is effectively washed off with water or a solvent.

Generally, ethylene copolymers have low photostability in spite of the high heat resistance. Therefore, an ultraviolet absorber or a photo stabilizer is preferably added thereto.

Photo Stabilizer

The photo stabilizer employed in the solar cell module of the present invention comprises an alkylated tertiary amine compound as determined from the results of comprehensive studies of the inventors of the present invention. The photo stabilizer comprising an alkylated tertiary amine compound gives excellent photostability and excellent heat stability to the surface coating material. The photo stabilizer includes tetra(1,2,2,6,6-pentamethyl-4-piperidyl)butane tetracarbonate, tri(1,2,2,6,6-pentamethyl-4-piperidyl) tridecylbutane tetracarbonate, bis(1,2,2,6,6-pentamethyl-4-piperidyl)bis(tridecyl)butane tetracarbonate, mono(1,2,2,6,6-pentamethyl-4-piperidyl)tris(tridecyl)butane tetracarbonate, bis-[tris(1,2,2,6,6-pentamethyl-4-piperidyl) butane tetracarbonato]sprioglycol, and copolymerizable stabilizer such as (1,2,2,6,6-pentamethyl-4-piperidyl) methacrylate, and (1,2,2,6,6-pentamethyl-4-piperidyl) acrylate.

The amount of the photo stabilizer is preferably in the range of from 0.01% to 5%, more preferably from 0.05% to 0.5%.

Ultraviolet Ray Absorber

The UV absorber employed in the present invention is explained below.

The UV absorber employed in the solar cell module protects the filler and other surface coating materials against ultraviolet light, but preferably does not absorb the effective wavelengths of light of the photovoltaic element. The suitable UV absorbers in the present invention are inorganic or polymeric in view of heat resistance and non-volatility.

The inorganic UV absorbers include titanium oxide, zinc oxide, and tin oxide, preferably having a particle size of 50 nm or less so as not to disturb the introduction of sunlight. In consideration of the absorption spectra, zinc oxide is suitable.

The polymeric UV absorber is exemplified by a copolymer of 2-hydroxy-4-(methacryloyloxyethoxy)-benzophenone with a monomer such as methyl acrylate, methyl methacrylate, ethylene, and ethylene-acrylate ester.

Surface Film

The surface film, which is placed on the surface of the coating materials of the solar cell module, is required to have weatherability and resistance to soiling in order to ensure the reliability of the solar cell module exposed to an outdoor environment for a long period. Suitable materials for the surface film in the present invention include poly (tetrafluoroethylene), polyvinyl fluoride, and polyvinylidene fluoride. Of these materials, poly(vinylidene fluoride) is preferred from the viewpoints of transparency and adhesiveness. For improvement of adhesiveness to the filler, the surface film is preferably subjected to corona treatment or plasma treatment.

The mechanical strength of the surface film can be increased by increasing the film thickness, or by stretching treatment. The stretching treatment is conducted by winding the extruded film at a high tension.

The present invention is described in more detail by reference to Examples. In the Examples and Comparative Examples, the unit "part" is based on weight.

EXAMPLE 1

An amorphous silicon (a-Si) solar cell, i.e., a photovoltaic element, was produced. The production steps are described by reference to FIG. 2.

On a cleaned stainless steel substrate 201, and Al layer of 5000 Å thickness and a ZnO layer of 5000 Å thickness were successively formed as the backside reflection layer 202 by sputtering.

Then, by plasma CVD, an a-Si layer having n-type conductivity was formed from a gas mixture of $SiH_4$, $PH_3$, and $H_2$; an a-Si layer having i-type conductivity was formed from a gas mixture of $SiH_4$ and $H_2$; a p-type microcrystalline silicon (μc-Si) layer was formed from a gas mixture of $SiH_4$, $BF_3$, and $H_2$. A tandem junction type a-Si photovoltaic semiconductor layer 203 was formed which is constituted of an n-type layer of 150 Å thickness, an i-type layer of 4000 Å thickness, a p-type layer of 100 Å thickness, an n-type layer of 100 Å thickness, an i-type layer of 800 Å thickness, and a p-type layer of 100 Å thickness.

Thereon, an $In_2O_3$ film of 700 Å thickness was formed as the transparent electroconductive layer 204 by resistance heating vapor deposition of In in an $O_2$ atmosphere.

Further, a grid electrode 205 for current collection was formed by screen printing with silver paste. A copper tab as a negative terminal was bonded to the stainless steel substrate 201 with stainless steel solder. A tin foil tape as a positive terminal was bonded to the current-collecting electrode by use of an electroconductive adhesive to form an output terminal 206. Thus a photovoltaic element was completed.

The filler containing a photo stabilizer, which is the feature of the present invention is explained below. A filler composition was prepared by blending 100 parts of EVA (ethylene-vinyl acetate copolymer) as the base polymer, 1.5 parts of organic peroxide (trade name Rupazol 101, produced by Pennwalt Co.) as the crosslinking agent, 0.2 part of the antioxidant (trade name Nowguard P, produced by Uniroyal Co.), 0.1 part of tetra(1,2,2,6,6-pentamethyl-4-piperidyl)butane tetracarbonate as the photo stabilizer, 0.1 part of zinc oxide (ultrafine particulate zinc oxide, trade name: ZnO-200, produced by Sumitomo Cement Co., Ltd.) as the UV absorber, and 0.25 part of γ-methacryltrimethoxysilane as the silane coupling agent. The blended composition was extruded from an extruder (trade name: GPD, manufactured by Yuri Roll Co.) into an EVA film of 460 μm thickness.

Figure 3:
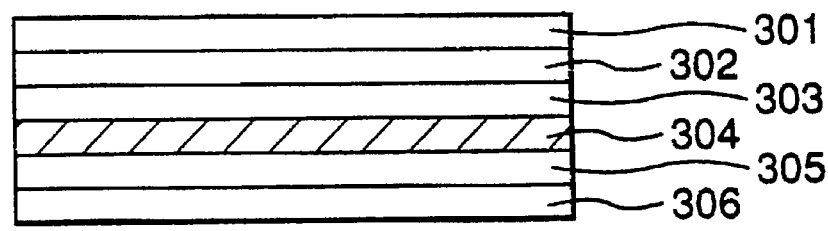
FIG. 3 is a schematic sectional view of another example of the solar cell module of the present invention.
Figure 4:
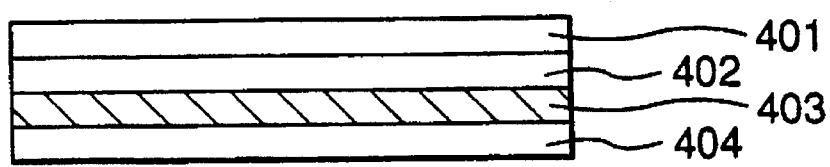
FIG. 4 is a schematic sectional view of a conventional solar cell module for comparison.

The process for coating the above photovoltaic element to prepare to prepare a solar cell module is explained by reference to FIG. 3.

On a galvanized steel sheet of 0.3 mm thickness as the reinforcing plate 306, there were successively overlaid in this order: the EVA film of 460 μm thickness prepared above as the backside adhesive 305, the photovoltaic element 304 prepared above, a glass nonwoven sheet (basis weight: 300 g/m², trade name: Glasper GMC, produced by Honshu Paper Co., Ltd.) as the reinforcing material 303, an EVA film of 460 μm thickness prepared above as the front face filler 302, an ethylene-tetrafluoroethylene copolymer film of 38 μm thickness (uniaxially stretched film, trade name: Tefzel, produced by DuPont Co.) as the surface layer 301. The stack was degassed, pressed, and heated by means of a vacuum laminator at a vacuum of 1 mmHg or lower pressure at 150° C. for 100 minutes. After sufficient cooling of the laminator, the module was taken out.

The resulting solar cell module was evaluated for the items below.

(1) Weatherability

The solar cell module was subjected to an accelerated weathering test in a sunshine weather meter (Shimazu Xenon Tester XW-150, intermittent irradiation). After 5000 hours of the test, the conversion efficiency was measured. The change of the conversion efficiency due to the weathering test is shown in Table 1 as a percentage of the initial conversion efficiency. The negative symbol (−) means a decrease.

(2) Heat Resistance

The solar cell module was kept in an atmosphere of 150° C. for 14 days, and the change in the conversion efficiency was measured.

(3) Humidity Resistance

The solar cell module was kept in an atmosphere of 85° C. temperature and relative humidity of 85% for 10 hours. Then the shunt resistance was measured by applying a reverse bias voltage of 1.0 V. A resistance relative to the initial value of 50% or higher was regarded as acceptable, and a value lower than 50% was regarded as rejected.

(4) Bonding Strength

EVA was heat bonded to the weathering face of a colored steel plate (anti-abrasion color GL, and anti-abrasion GL 540). The size of the specimen was 25 mm wide. The bonding strength was measured as the peeling strength at a peeling angle of 180° at a peeling rate of 50 mm/min. When the EVA ruptured, the EVA was backed with a polycarbonate film of 250 μm thickness.

(5) Initial Conversion Efficiency

The initial conversion efficiency of the module was measured by use of a light source of AM 1.5. The initial conversion efficiency of the module of Example 1 is defined to be the normal value of 1.00.

EXAMPLE 2

A solar cell module was prepared in the same manner as in Example 1 except that 0.1 part of bis[tris(1,2,2,-6,6,-pentamethyl-4-piperidyl)butane tetracarbonato]-spiroglycol was used as the photo stabilizer in place of that of Example 1.

EXAMPLE 3

A solar cell module was prepared in the same manner as in Example 1 except that 0.5 part of a copolymer of 2-hydroxy-4-(methacryloyloxyethoxy)-benzophenone with methyl methacrylate (copolymerization ratio of 30 to 70 by weight, molecular weight of 350,000) was used as a polymeric UV absorber in place of the UV absorber in Example 1.

EXAMPLE 4

A solar cell module was prepared in the same manner as in Example 1 except that 0.3 part of 2-hydroxy-4-n-octoxybenzenophenone was used as the UV absorber in place of the one of Example 1.

EXAMPLE 5

A solar cell module was prepared in the same manner as in Example 1 except that EEA (ethyl acrylate unit content: 25%) was used as the base polymer in place of EVA of Example 1.

EXAMPLE 6

A solar cell module was prepared in the same manner as in Example 1 except that a photovoltaic element having a high shunt resistance was selected.

COMPARATIVE EXAMPLE 1

A solar cell module was prepared in the same manner as in Example 1 except that the photo stabilizer was changed to 0.1 part of bis(2,2,6,6-tetramethyl-4-piperidyl) sebacate (trade name: Tinuvin 770 produced by Ciba Geigy Co.), and the UV absorber was changed to 0.3 part of 2-hydroxy-4-n-octoxybenzophenone (trade name UV 531, produced by Cyanamide Co.).

COMPARATIVE EXAMPLE 2

A solar cell module was prepared in the same manner as in Example 1 except that the photo stabilizer was not used, and the UV absorber was changed to 0.3 part of 2-hydroxy-4-n-octoxybenzophenone (trade name UV 531, produced by Cyanamide Co.).

COMPARATIVE EXAMPLE 3

A solar cell module was prepared in the same manner as in Example 1 except that a photovoltaic element with extremely low shunt resistance was selected.

COMPARATIVE EXAMPLE 4

A solar cell module was prepared in the same manner as in Example 1 except that a photovoltaic element with extremely high shunt resistance was selected.

COMPARATIVE EXAMPLE 5

A solar cell module was prepared in the same manner as in Example 1 except that the photo stabilizer was changed to 0.1 part of bis(2,2,6,6,tetramethyl-4-piperidyl) sebacate trade name: Tinuvin 770 produced by Ciba Geigy Co.), the UV absorber was changed to 0.3 part of 2-hydroxy-4-n-octoxybenzophenone (trade name UV 531, produced by Cyanamide Co.), and the organic peroxide (trade name: Rupazol, half life: one hour at 138° C.) was changed to t-butylperoxy maleate (trade name: Ruperco, produced by Atokemu Yoshitomi K.K., half life: one hour at 110° C.).

COMPARATIVE EXAMPLE 6

A solar cell module was prepared in the same manner as in Comparative Example 5 except that the lamination conditions were changed from 150° C. and 100 minutes to 122° C. and 100 minutes.

Table 1 shows the results of evaluation of the solar cell modules of the Examples and Comparative Examples.

As shown in Table 1, the solar cell modules having a surface coating material containing a light stabilizer comprising a tertiary amine compound according to the present invention are excellent in weatherability and heat resistance, not changing the appearance at all after the temperature cycle tests and temperature-humidity cycle tests corresponding to severe outdoor conditions, deteriorating little in humidity resistance tests, having sufficient bonding strength, and exhibiting high initial conversion.

Examples 1 and 2 show that addition of an inorganic UV absorber improves the weatherability. Example 3 shows that addition of a polymeric UV absorber also improves the weatherability. Example 4 shows that the surface coating material containing a photo stabilizer comprising a tertiary amine compound improves the weatherability. Example 5 shows that the surface coating material of EEA containing a photo stabilizer comprising a tertiary amine compound improves the weatherability.

The surface coating of the solar cell module in the present invention is not limited by the above Examples, and can be modified within the gist of the invention.

The solar cell module of the present invention which has a surface coating material containing a photo stabilizer comprising a tertiary amine compound is excellent in weatherability and heat resistance, causing no problem after the temperature cycle tests and temperature-humidity cycle tests corresponding to severe outdoor conditions.

TABLE 1

|  | Shunt resistance | Weather-ability | Heat resistance | Humidity resistance | Reverse bias test | Bonding strength | Initial conversion efficiency |
|---|---|---|---|---|---|---|---|
| Example |  |  |  |  |  |  |  |
| 1 | 170K | −1 | −2 | 23 | Acceptable | 5.5 | 1.00 |
| 2 | 150K | −1 | −2 | 21 | Acceptable | 5.6 | 1.00 |
| 3 | 110K | −2 | −3 | 24 | Acceptable | 5.1 | 1.00 |
| 4 | 110K | −3 | −3 | 22 | Acceptable | 5.5 | 1.00 |
| 5 | 110K | −1 | −2 | 7 | Acceptable | 5.8 | 1.00 |
| 6 | 470K | −1 | −2 | 15 | Acceptable | 5.4 | 1.00 |
| Comparative Example |  |  |  |  |  |  |  |
| 1 | 150K | −9 | −10 | 22 | Acceptable | 5.5 | 0.98 |
| 2 | 140K | −13 | −50 | 21 | Acceptable | 5.3 | 0.98 |
| 3 | o.8K | −1 | −2 | 30 | Rejected | 5.4 | 0.98 |
| 4 | 610K | −1 | −2 | 16 | Acceptable | 5.2 | 0.98 |
| 5 | 150K | −1 | −2 | 16 | Acceptable | 1.5 | 0.98 |
| 6 | 160K | −1 | −2 | 16 | Acceptable | 0.4 | 1.00 |

What is claimed is:

1. A solar cell module comprising a photovoltaic element, a filler layer, and an outer surface coating layer provided on a light-introducing side of said photovoltaic element, wherein said filler layer contains an alkylated tertiary amine compound and said surface coating layer is formed from a fluororesin film.

2. The solar cell module according to claim 1, wherein said filler layer is formed from an ethylene type copolymer.

3. The solar cell module according to claim 1, wherein said filler layer is formed from a copolymer resin of an unsaturated fatty acid ester.

4. The solar cell module according to claim 1, wherein said surface coating layer contains an inorganic UV absorber.

5. The solar cell module according to claim 1, wherein said surface coating layer contains a polymeric UV absorber.

6. The solar cell module according to claim 1, wherein the shunt resistance of the photovoltaic element ranges from 2,000 to 200,000 $\Omega cm^2$.

7. The solar cell module according to claim 1, wherein said filler layer contains a crosslinking agent.

8. The solar cell module according to claim 1, wherein said filler layer contains a silane coupling agent.

9. The solar cell module according to claim 1, wherein the side of said surface coating layer in contact with said filler layer is corona treated or plasma treated.

10. The solar cell module according to claim 1, wherein said surface coating layer is subjected to a stretching treatment.

11. The solar cell module according to claim 1, wherein said photovoltaic element comprises a non-monocrystalline semiconductor.

12. A solar cell module comprising, in order:
1) a backside coating layer;
2) a backside filler layer;
3) a photovoltaic element provided on a substrate;
4) a front surface filler layer; and
5) a front surface coating layer, wherein said front surface filler layer contains an alkylated tertiary amine compound and said front surface coating layer is formed from a fluororesin film.

13. The solar cell module according to claim 12, wherein said front surface filler layer is formed from an ethylene type copolymer.

14. The solar cell module according to claim 12, wherein said front surface filler layer is formed from a copolymeric resin of an unsaturated fatty acid ester.

15. The solar cell module according to claim 12, wherein said front surface coating layer contains an inorganic UV absorber.

16. The solar cell module according to claim 12, wherein said front surface coating layer contains a polymeric UV absorber.

17. The solar cell module according to claim 12, wherein said front surface filler layer contains a crosslinking agent.

18. The solar cell module according to claim 12, wherein said front surface filler layer contains a silane coupling agent.

19. The solar cell module according to claim 12, wherein the side of said front surface coating layer in contact with said front surface filler layer is corona treated or plasma treated.

20. The solar cell module according to claim 12, wherein said front surface coating layer is subjected to a stretching treatment.

21. A solar cell module comprising, in order:
1) a reinforcing plate;
2) a backside adhesive layer;
3) a photovoltaic element;
4) a reinforcing material;
5) a front surface filler layer; and
6) a front surface coating layer, wherein said front surface filler layer contains an alkylated tertiary amine compound and said front surface coating layer is formed from a fluororesin film.

22. The solar cell module according to claim 21, wherein said front surface filler layer is formed from an ethylene type copolymer.

23. The solar cell module according to claim 21, wherein said front surface filler layer is formed from a copolymeric resin of an unsaturated fatty acid ester.

24. The solar cell module according to claim 21, wherein said front surface coating layer contains an inorganic UV absorber.

25. The solar cell module according to claim 21, wherein said front surface coating layer contains a polymeric UV absorber.

26. The solar cell module according to claim 21, wherein said front surface filler layer contains a crosslinking agent.

27. The solar cell module according to claim 21, wherein said front surface filler layer contains a silane coupling agent.

28. The solar cell module according to claim 21, wherein a side of said front surface coating layer in contact with said front surface filler layer is corona treated or plasma treated.

29. The solar cell module according to claim 21, wherein said front surface coating layer is subjected to a stretching treatment.

* * * * *

UNITED STATES PATENT AND TRADEMARK OFFICE
CERTIFICATE OF CORRECTION

PATENT NO. : 5,660,645

DATED : August 26, 1997

INVENTOR(S): TAKAHIRO MORI ET AL.

Page 1 of 2

It is certified that error appears in the above-identified patent and that said Letters Patent is hereby corrected as shown below:

COLUMN 2
   Line 41, "Promotion" should read --Propulsion--;
   Line 64, "cross linking" should read --crosslinking--;
   Line 65, "a" (second occurrence) should be deleted.

COLUMN 3
   Line 57, "fluororesin based" should read --fluororesin-based--.

COLUMN 5
   Line 1, "therefore" should read --therefor--.

COLUMN 9
   Line 64, "and" should read --an--.

UNITED STATES PATENT AND TRADEMARK OFFICE
CERTIFICATE OF CORRECTION

PATENT NO. : 5,660,645

DATED : August 26, 1997

INVENTOR(S): TAKAHIRO MORI ET AL.

It is certified that error appears in the above-identified patent and that said Letters Patent is hereby corrected as shown below:

COLUMN 10
Line 39, "to prepare" should be deleted.

COLUMN 12
Line 27, "trade" should read --(trade--.

Signed and Sealed this

Twenty-eighth Day of April, 1998

Attest:

BRUCE LEHMAN

*Attesting Officer*  *Commissioner of Patents and Trademarks*